US006335614B1

(12) United States Patent
Ganti

(10) Patent No.: US 6,335,614 B1
(45) Date of Patent: Jan. 1, 2002

(54) BANDGAP REFERENCE VOLTAGE CIRCUIT WITH START UP CIRCUIT

(75) Inventor: Ramkishore Ganti, Elmherst, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,600

(22) Filed: Sep. 29, 2000

(51) Int. Cl.[7] .................................................. G05F 3/16

(52) U.S. Cl. ....................................... 323/317; 323/901

(58) Field of Search ................................ 323/901, 313, 323/314, 315, 317

(56) References Cited

U.S. PATENT DOCUMENTS 3,648,154 A 3/1972 Frederiksen et al.
4,339,707 A 7/1982 Gorecki
4,857,823 A 8/1989 Bitting
5,087,830 A 2/1992 Cave et al.
5,545,978 A 8/1996 Pontius
5,742,155 A * 4/1998 Susak et al. ................ 323/901
5,949,227 A * 9/1999 Bujanos ...................... 323/313
5,955,873 A * 9/1999 Maccarone et al. .......... 323/314

* cited by examiner

*Primary Examiner*—Shawn Riley
(74) *Attorney, Agent, or Firm*—Connolly Bove Lodge & Hutz

(57) ABSTRACT

A circuit and method for initiating operation of a bandgap reference circuit. A start pulse circuit provides a start pulse when the bandgap circuit is powered up. A transistor receives the pulse as an input, and applies the pulse to a regenerative bandgap reference circuit. The bandgap reference circuit output voltage is forced above a normal output voltage, producing a feedback current through the bandgap reference circuit, providing a current level which exceeds the normal stable operating level and output voltage level range. When the pulse ceases, the regenerative bandgap reference circuit output voltage decreases to its normal stable value, and the regenerative bandgap reference circuit is placed in its normal stable operating state.

16 Claims, 2 Drawing Sheets

BANDGAP REFERENCE VOLTAGE CIRCUIT WITH START UP CIRCUIT

DESCRIPTIVE TITLE OF THE INVENTION

The present invention relates to bandgap circuits which generate a substantially temperature insensitive voltage reference signal. Specifically, a bandgap circuit is provided which avoids any metastable operation.

Bandgap circuits are used in bipolar and BiCMOS circuit designs for producing a stable reference voltage. The stable reference voltage is used to control other voltage levels within a chip, and to provide a bias current that is proportional to absolute temperature. The voltage regulation and bias current applications are used extensively in analog circuits such as cellular telephone applications. Bandgap circuits must not only provide the required voltage and current functions, but must be power efficient since the cellular telephone circuits are powered by batteries. The bandgap circuit is integral to the operation of the circuit, and its reliability is essential to avoid catastrophic circuit failure.

The bandgap circuits are known to have three operating states. The first operating state provides a normal operation which produces the required regulated voltage, or bias current. The second state is a zero current state, which means that the circuit is not operable at all. The third operating state is the metastable state representing a circuit failure. One of the more common problems with bandgap circuits is the failure to enter the normal operational state from the zero state. If the bandgap circuit enters the metastable state, the output voltage does not attain a final reference value, and the circuit may remain in the metastable state, with the result that the entire cellular telephone circuit may fail.

The solution to the problem is to provide additional start-up circuitry which forces the bandgap circuit into its normal operational state. However, additional start-up circuitry adds overhead to the power budget for the circuit device placing additional burden upon the battery power supply.

BRIEF SUMMARY OF THE INVENTION

The present invention provides a start-up circuit which unconditionally places a bandgap circuit in its normal stable operational state independent of manufacturing process variations, temperature variations and power voltage supply variations. The pulse start-up circuit does not interfere with normal bandgap operations, and draws no additional current from the power supply once the bandgap circuit is in the normal, stable operational mode.

In accordance with the invention, a start pulse circuit generates a pulse when the power supply voltage is applied to the bandgap circuit. The pulse is applied through a transistor to the regenerative bandgap reference circuit, and forces the output voltage of the regenerative bandgap reference circuit to a voltage higher than the normal output voltage. At the end of the pulse, the regenerative bandgap reference circuit output voltage decreases to a stable normal voltage reference value, avoiding the metastable state.

In accordance with one embodiment of the invention, a momentary start pulse is produced from a logic gate and delay circuit. The enable voltage for the bandgap reference circuit is applied to the delay circuit and a second input of the logic gate. A pulse is formed from the logic gate which is used to drive the regenerative bandgap reference circuit into an overvoltage output state. Once the pulse has ended, the delay circuit and logic gate are effectively decoupled from the bandgap circuit and no additional power burden occurs on the battery power supply.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DETAILED DESCRIPTION OF THE PREFERRED EMBODIMENT

Figure 1:
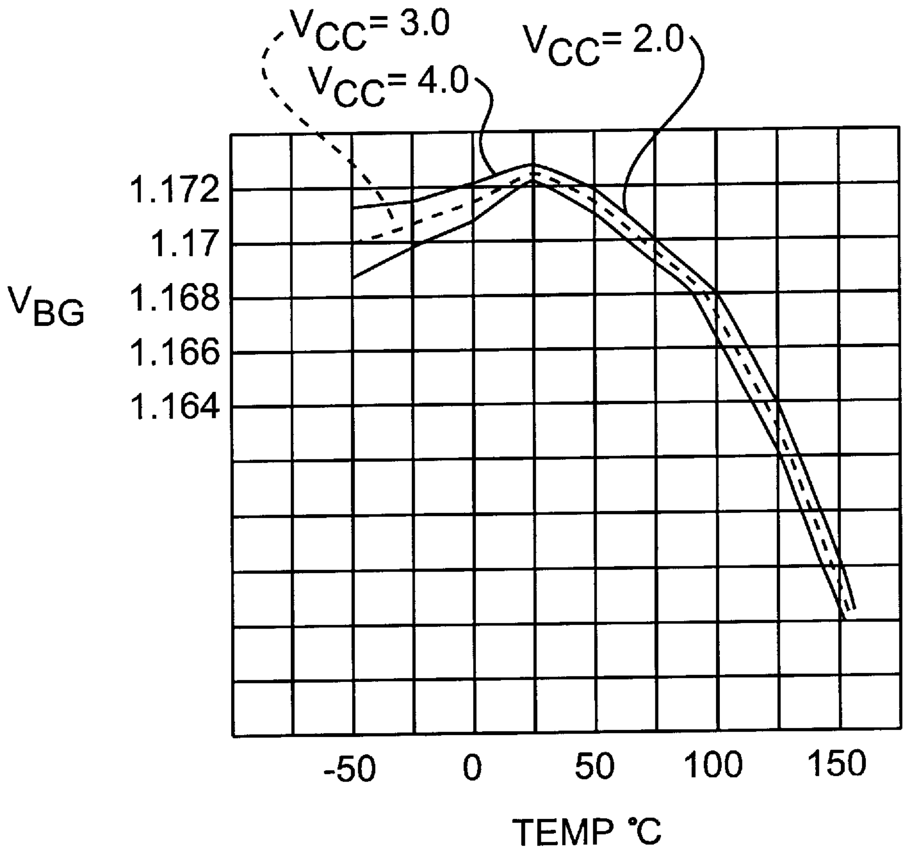
FIG. 1 illustrates bandgap circuit operation state.

The bandgap reference voltage circuit produces a bandgap voltage $V_{BG}$ which remains essentially constant over changes in voltage supply as well as temperature. FIG. 1 illustrates a steady state bandgap performance when the bandgap circuit is operating in its normal, stable mode of operation. $V_{BG}$ remains essentially the same with variations in $V_{CC}$, the supply voltage over a temperature range of −50° C. to +150° C.

Figure 2:
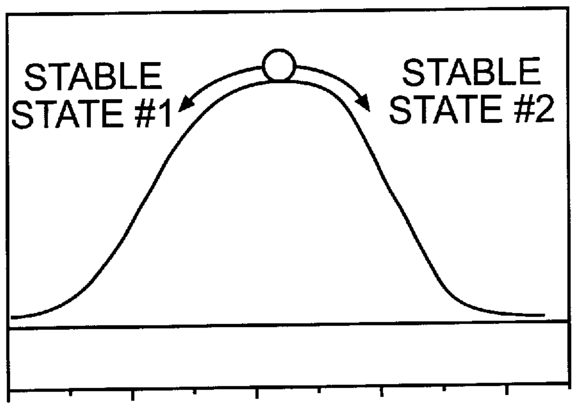
FIG. 2 illustrates the bandgap output voltage $V_{BG}$ over different power supply voltages and temperatures.

The circuit has two stable states, 1) the zero state where no current is conducted through the bandgap circuit, and 2) the normal stable where the final reference output voltage is derived, shown in FIG. 2. The circuit may operate in a metastable state, illustrated in FIG. 2, which is unstable and between the zero state and normal state. Metastable state operation may last, for a brief period of time, with the circuit then assuming one or the other of the stable states to FIG. 1.

The bandgap reference voltage circuit 12 comprises two bipolar transistors 13 and 14, having emitter area ratios of N, which receive identical currents I from the current mirror circuit 29. When MOSFET 18 is enabled, two current values of I are produced from MOSFETS 16, 16 to the collectors of transistors 13 and 14. The emitters of transistors 13 and 14 are connected to resistor 19 and resistor 20. The output voltage $V_{BG}$ for the bandgap circuit is essentially the base voltage which has been produced from bipolar transistors 13 and 14.

Figure 3:
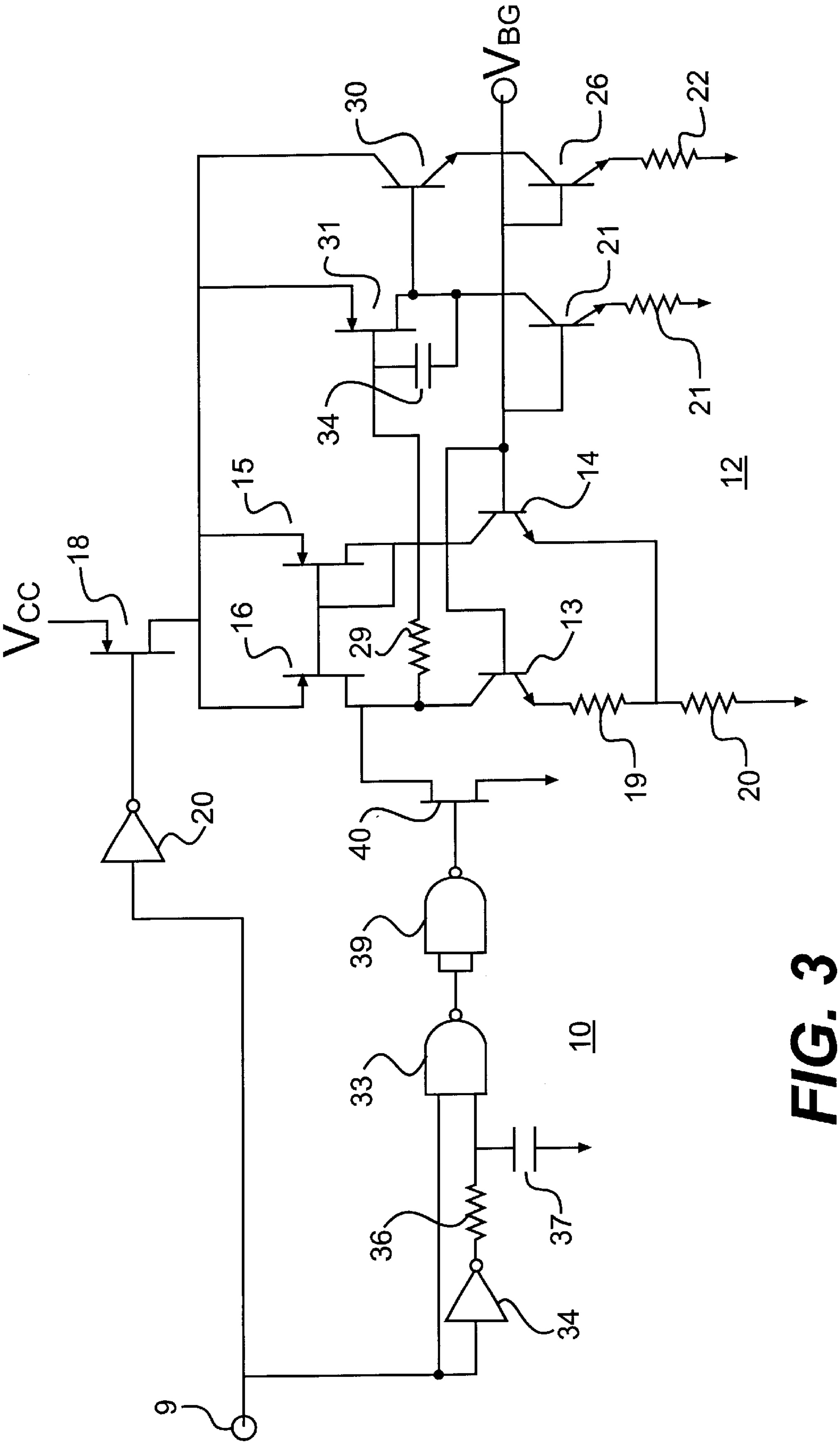
FIG. 3 is a schematic drawing of a preferred embodiment in accordance with the present invention.

The bandgap voltage, which can be demonstrated for the embodiment of FIG. 3, to be substantially independent from temperature and power supply voltage variations, is a function of the values of resistors 19, and 20. Assuming I to be equal currents flowing through the collectors of transistors 13 and 14 from the current mirror comprising MOFSET 15, 16, the bandgap voltage $V_{BG}$ may be expressed as follows:

$$2IR_3+IR_6+VBE_{14}=VBG \quad (1)$$

$$2IR_3+VBE_{13}=VBG \quad (2)$$

where $R_3$ is the value of resistor 20, and $R_6$ is the value of resistor 19.

The base emitter voltage for each of the transistors 19 and 20 can be expressed as follows:

$$VBE_{14}-VBE_{13}=IR_6 \quad (3)$$

Each of the currents through the collectors of transistors 13 and 14, may be represented as follows:

$$I_{13} = I = nI_s e\left(\frac{V_{BE_{13}}}{VT}\right) \quad (4)$$

$$I_{14} = I = I_s e\left(\frac{V_{BE_{14}}}{VT}\right) \quad (5)$$

where $I_s$ is the saturation current for each of the transistors 13 and 14. N is the ratio of the emitter areas of the transistors 13 and 14, and can be solved from the foregoing equations 4 and 5 by dividing equations 4 and 5 to derive the value of n:

$$e{:}\left(\frac{V_{BE_{14}} - V_{BE_{13}}}{VT}\right) = n \quad (6)$$

The above representation may be represented as $$VBE_{14} - VBE_{13} = V_T \mathrm{Inn} \quad (7)$$

From equations, a value of current I can be derived as follows:

$$V_T \mathrm{Inn} = IR_6 \quad (8)$$

$$I = \frac{V_T}{R_6} \ln n \quad (9)$$

From equation 7 and 1, a value of the bandgap voltage may be derived as follows:

$$VBE_{13} + VT(\ln(n))\left(1 + \frac{2R_3}{R_6}\right), \quad (10)$$

where $VBE_{13}$ has a negative temperature coefficient, and VT, which equals $$\frac{KT}{Q}$$

has a positive temperature coefficient.

The present invention avoids the metastable state by applying a pulse of limited duration to force the regenerative bandgap circuit to produce an output voltage higher than the stable state reference value. A pulse circuit for providing the pulse is shown as 10 in FIG. 3. Turning now to FIG. 3, an input voltage level is applied to 9 which renders the bandgap circuit operable. An inverter 20 enable MOSFET 18 in response to the voltage level applied at 9 to provide current from the battery power supply $V_{CC}$ to the bandgap circuit.

The enable voltage applied to 9 is used to initiate a start pulse from the start pulse circuit 10. The start pulse circuit 10 includes a NAND gate 33 having first and second inputs. A first input is connected to a delay circuit comprising series resistor 36 and capacitor 37. The enable voltage applied at 9 is applied to the second input of NAND gate 33, and to an inverter 34 which supplies an inverted enable voltage to the delay circuit. The result is a pulse from NAND gate 33 having a duration defined by the delay time of the delay circuit which is inverted by NAND gate 39.

The inverted start pulse is used to render a MOSFET 40 conductive, which forces the output voltage $V_{BG}$ of the bandgap circuit 12 to a higher voltage than the steady state reference voltage produced in the stable state. These offsetting temperature coefficients result in a steady voltage V bandgap $V_{BG}$.

The foregoing stable bandgap voltage $V_{BG}$ is forced by the pulse from MOSFET 40. MOSFET 40 drives the collector of bipolar transistor 13 high, and applies a gate voltage on MOSFET 31 through resistor 29. The result is that MOSFET 31 conducts current, driving the emitter of bipolar transistor 30 high. The emitter of transistor 30 is connected to the base of each of transistors 26, 21 and the two bipolar transistors 13 and 14 of the bandgap reference circuit. The result is that the bandgap output voltage $V_{BG}$ rises, thereby forcing transistors 13 and 14 into higher conduction levels, raising the output voltage $V_{BG}$ above the stable operating voltage. As the pulse produced by pulse circuit 10 ends, the output voltage $V_{BG}$ decreases to the level of the second stable output voltage $V_{BG}$. Following the ceasation of the start-up pulse MOSFET 40 and MOSFET 31 are rendered off. As a collector of transistor 13 is driven lower in voltage, the MOSFET 31 will be held into conduction even though the start pulse has been removed. Voltage is fed back from the output node $V_{BG}$ to the base of bipolar transistors 13 and 14, maintaining the voltage at its stable state. Transistors 30 and 26 provide current gain for driving a load impedance which may be connected to the output reference node $V_{BG}$.

Because the bandgap voltage $V_{BG}$ has been driven to over shoot its stable state by the start pulse, reliable starting of the circuit results. The values for resistor 36 and capacitor 37 are selected so that the bandgap voltage $V_{BG}$ will sufficiently overshoot the reference bandgap voltage, avoiding any possibility of the bandgap circuit getting stuck in the metastable state.

Following the starting of the bandgap circuit, the pulse start circuit 10 ceases operation avoiding any unnecessary power consumption.

When the enable voltage 9 is returned to 0, indicating that power is being removed from the bandgap circuitry, transistor 18 is turned off and the circuit returns to a zero current stable state. The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuit for initiating operation of a regenerative bandgap reference circuit comprising:

a start pulse circuit for generating a pulse in response to a signal which initiates operation of said bandgap circuit; and a transistor connected to receive said pulse and applying said pulse to said regenerative bandgap reference circuit output, forcing an output voltage above a metastable state and above a normal output voltage for the duration of said pulse wherein said bandgap circuit current enters a stable operating voltage range following said pulse.

2. The circuit for initiating operation of a bandgap reference circuit according to claim 1 wherein said start pulse circuit comprises:

a delay circuit for receiving said signal which initiates operation of said reference bandgap circuit; and a logic gate for forming a pulse from said signal which initiates operation of said bandgap circuit and from a voltage transition from said delay circuit.

3. The circuit for initiating operation of said bandgap circuit according to claim 2, wherein said logic gate provides a NAND function and receives said voltage from said delay circuit and said signal on first and second inputs, respectively.

4. The circuit of claim 1 wherein said transistor is connected to enable conduction of first and second output transistors of said bandgap circuit so that a feedback voltage is produced which increases an output voltage of said transistors above a normal bandgap output reference voltage.

5. The circuit of claim 3 wherein said delay circuit includes a resistor serially connecting said signal to said logic gate, and a capacitor connected to said logic gate whereby a signal received by said logic gate is delayed.

6. A circuit for starting a bandgap circuit so that said bandgap circuit assumes a stable state which provides a bandgap reference voltage comprising:

a logic circuit having first and second inputs, said first input connected to receive an enable signal for enabling said bandgap circuit to operate;

an inverter connected to receive said enable signal;

a resistor and capacitor combination for receiving an inverted enable signal from said inverter and delaying said inverted signal; and said logic circuit connected to receive a delayed and inverted enable signal from said resistor and capacitor combination and producing a pulse having a beginning and trailing edge separated by an amount of time corresponding to a time determined by said resistor-capacitor combination; and an MOS transistor connected to said logic circuit and said bandgap circuit for forcing a voltage on an output of said bandgap circuit which is higher than a normal bandgap circuit voltage produced by said bandgap circuit, whereby said bandgap circuit is forced into a stable operating mode.

7. The circuit according to claim 6 further comprising an inverter circuit connected between said logic circuit and said MOS transistor.

8. The circuit according to claim 6 wherein said logic circuit is a NAND gate.

9. A method for starting a bandgap circuit operation comprising:

creating a pulsed signal from an enable signal applied to said bandgap circuit; and coupling said pulsed signal to an output transistor of said bandgap circuit whereby said output transistor produces a voltage higher than a bandgap circuit output voltage, forcing said bandgap circuit to assume a stable state when said pulse ends.

10. The method for starting a bandgap circuit according to claim 9 wherein said step of creating a pulsed signal comprises:

delaying said enable signal; and combining said enable signal with a delayed enable signal in a logic circuit whereby said logic gate produces a pulse from the leading edges of said enable signal and delayed enable signal.

11. The method according to claim 10 wherein said step of delaying said enable signal comprises:

applying said enable signal to a resistor which is terminated with a capacitor.

12. The method according to claim 10 wherein said logic circuit combines the two signals as logical NAND function.

13. The method according to claim 10 wherein said delayed signal is inverted before it is combined by said logic circuit.

14. A circuit for establishing a stable operating state for a bandgap circuit comprising:

a bandgap circuit having first and second bipolar transistors, said transistorshaving emitters connected to first and second ends of a first resistor; a second resistor connected to said second end of said first resistor and to a common terminal; and a current source for supplying equal currents to each collector of said transistors from a voltage supply terminal; said transistors having base connections connected together forming an output node of a substantially temperature invariant voltage; a third bipolar transistor having an emitter connected to a collector of a fourth bipolar transistor and to said output node, and a collector connected to a terminal of a voltage supply, said fourth transistor having an emitter connected to said common connection through a third resistor, and a base connected to said output node; and a fifth bipolar transistor having a collector connected to a base of said third transistor, an emitter connected to said common connection through a fourth resistor, and a base connected to said output node; and a start up circuit for generating a pulse and coupling the pulse to the output node which forces said bandgap circuit bipolar transistors into a stable state.

15. The circuit for establishing a stable operating state according to claim 13 further comprising a MOSFET having a gate connected to said first bipolar transistor collector, and a drain source serially connected with said voltage supply terminal and said fifth transistor collector, wherein said start up circuit applies said pulse to the collector of said first transistor which increases the current through said third and fourth transistors thereby increasing the current through said first and second transistors.

16. The circuit for establishing a stable operating state according to claim 14 wherein said pulse start up circuit comprises a delay circuit connected to one input of a logic circuit, said logic circuit producing an output pulse in response to an enable voltage applied to said delay circuit and a second input of said logic circuit.

* * * * *

CERTIFICATE OF CORRECTION

PATENT NO. : 6,335,614 B1
DATED : January 1, 2002
INVENTOR(S) : Ramkishore Ganti et al.

It is certified that error appears in the above-identified patent and that said Letters Patent is hereby corrected as shown below:

Title page,
Item [75], Inventor, please add -- James F. Imbornone, Methuen, MA --
Item [12], should read -- Ganti, et al. --

Signed and Sealed this

Tenth Day of September, 2002

*Attest:*

JAMES E. ROGAN
*Director of the United States Patent and Trademark Office*

*Attesting Officer*